(12) United States Patent
Fastow

(10) Patent No.: US 6,363,014 B1
(45) Date of Patent: Mar. 26, 2002

(54) LOW COLUMN LEAKAGE NOR FLASH ARRAY-SINGLE CELL IMPLEMENTATION

(75) Inventor: Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/694,688

(22) Filed: Oct. 23, 2000

(51) Int. Cl.[7] .............................. G11C 11/34
(52) U.S. Cl. .............................. 365/185.18; 365/185.17
(58) Field of Search ................... 365/185.17, 185.18

(56) References Cited

U.S. PATENT DOCUMENTS

| | | | |
|---|---|---|---|
| 4,698,787 A | 10/1987 | Mukherjee et al. ......... 365/185 |
| 5,650,964 A | 7/1997 | Chen et al. ............. 365/185.25 |
| 5,943,262 A | 8/1999 | Choi ..................... 365/185.17 |
| 5,949,718 A | 9/1999 | Randolph et al. ....... 365/185.33 |
| 5,989,959 A | 11/1999 | Araki ..................... 438/258 |
| 6,033,955 A | 3/2000 | Kuo et al. ................. 438/257 |
| 6,144,584 A | * 11/2000 | Kunori et al. ......... 365/185.18 |

* cited by examiner

*Primary Examiner*—David Nelms
*Assistant Examiner*—M. Tran
(74) *Attorney, Agent, or Firm*—Eschweiler & Associates, LLC

(57) ABSTRACT

The present invention relates to a NOR-type flash memory array architecture, comprising a plurality of flash memory cells spatially organized in a column, wherein a drain terminal of each of the flash memory cells are coupled together and form an array bitline input. Further, a control gate terminal of each of the flash memory cells is coupled to a different wordline input and at least one of the flash memory cells has a source terminal which is electrically isolated from one or more of the source terminals of the other flash memory cells.

10 Claims, 6 Drawing Sheets

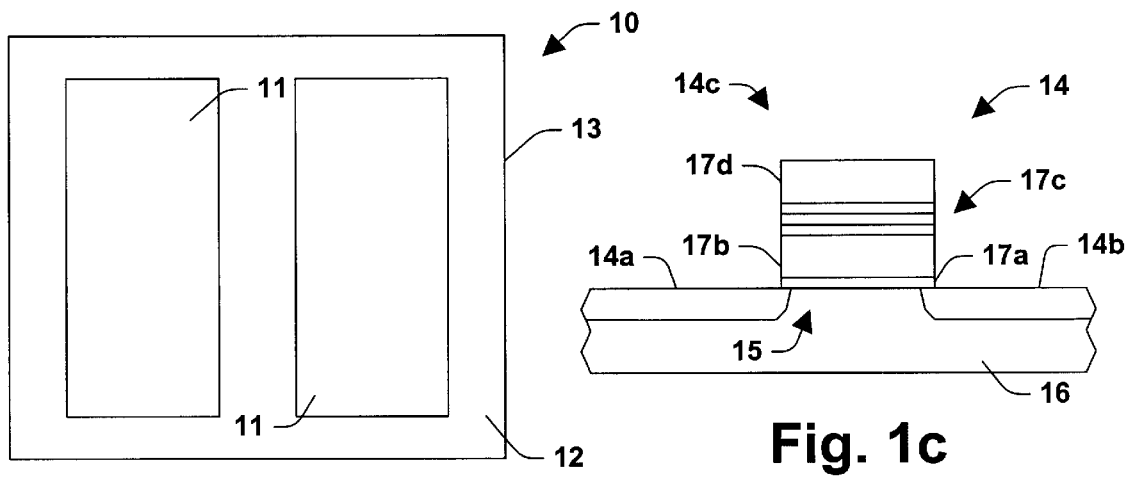
Fig. 1a
Fig. 1c
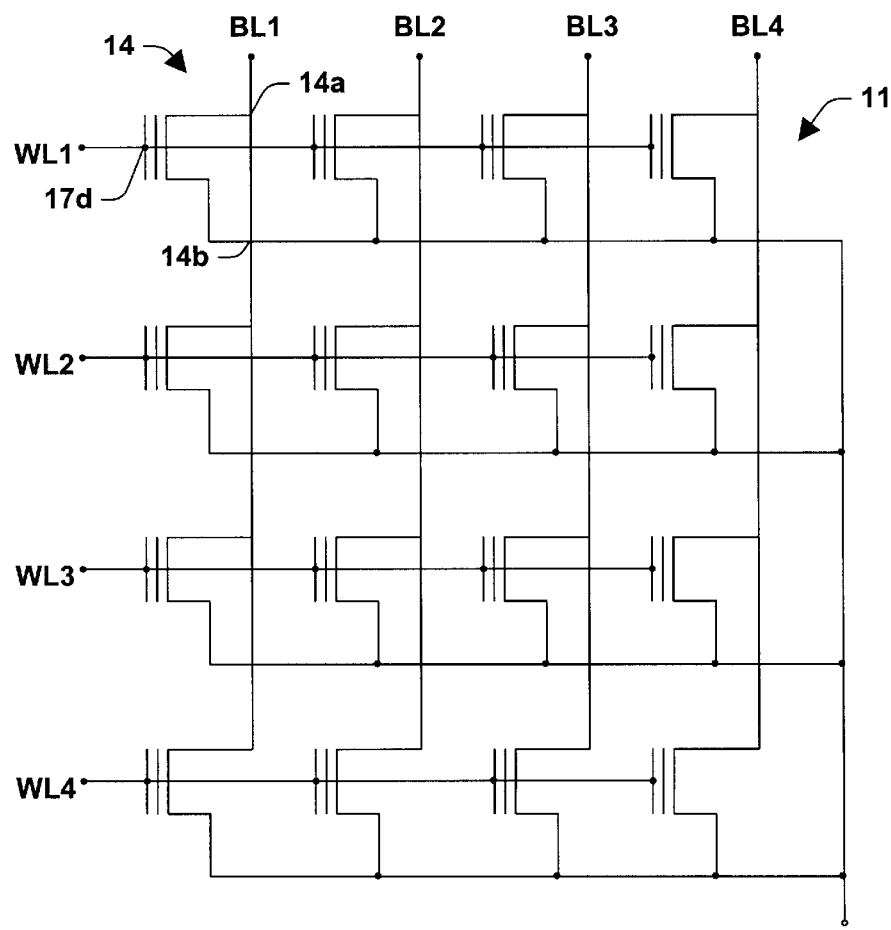
Fig. 1b

LOW COLUMN LEAKAGE NOR FLASH ARRAY-SINGLE CELL IMPLEMENTATION

FIELD OF THE INVENTION

The present invention generally relates to floating gate memory devices such as an array of flash memory cells, and relates more particularly to a circuit architecture and method for reading and programming NOR flash arrays to reduce column leakage associated therewith.

BACKGROUND OF THE INVENTION

As is generally known, in recent years a new category of electrically erasable EPROMs/EEPROMs has emerged as an important non-volatile memory which combines the advantages of EPROM density with EEPROM electrical erasability and are sometimes referred to as "flash" EPROM or EEPROM. Flash memory devices typically include multiple individual components formed on or within a substrate. Such devices often comprise a high density section and a low density section. For example, as illustrated in prior art FIG. 1a, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 11 are coupled together in a NOR-type circuit configuration, such as, for example, the configuration illustrated in prior art FIG. 1b. Each memory cell 14 has a drain 14a, a source 14b and a stacked gate 14c.

The NOR configuration illustrated in FIG. 1b has each drain terminal 14a of the transistors within a single column connected to the same bit line (BL). In addition, each flash cell 14 has its stacked gate terminal 14c coupled to a different word line (WL) while all the flash cells in the array have their source terminals 14b coupled to a common source terminal (CS). In operation, individual flash cells may be individually addressed via the respective bit line and word line using peripheral decoder and control circuitry for programming (writing), reading or erasing functions.

Prior art FIG. 1c represents a fragmentary cross section diagram of a typical memory cell 14 in the core region 11 of prior art FIGS. 1a and 1b. Such a cell 14 typically includes the source 14b, the drain 14a, and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, e.g., prior art FIG. 1b). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

According to conventional operation, the flash memory cell 14 operates in the following manner. The cell 14 is programmed by applying a relatively high voltage $V_G$ (e.g., approximately 10 volts) to the control gate 17d and connecting the source to ground and the drain 14a to a predetermined potential above the source 14b. These voltages generate a vertical and lateral electric field along the length of the channel from the source to the drain. This electric field causes electrons to be drawn off the source and begin accelerating toward the drain. As they move along the length of the channel, they gain energy. If they gain enough energy, they are able to jump over the potential barrier of the oxide into the floating gate 17b and become trapped in the floating gate 17b since the floating gate 17b is surrounded by insulators (the interpoly dielectric 17c and the tunnel oxide 17a). As a result of the trapped electrons, the threshold voltage of the cell 14 increases, for example, by about 2 to 5 volts. This change in the threshold voltage (and thereby the channel conductance) of the cell 14 created by the trapped electrons is what causes the cell to be programmed.

To read the memory cell 14, a predetermined voltage $V_G$ that is greater than the threshold voltage of an unprogrammed or erased cell, but less than the threshold voltage of a programmed cell, is applied to the control gate 17d with a voltage applied between the source 14b and the drain 14a (e.g., tying the source 14b to ground and applying about 1–2 volts to the drain 14a). If the cell 14 conducts (e.g., about 50–100 $\mu A$), then the cell 14 has not been programmed (the cell 14 is therefore at a first logic state, e.g., a zero "0"). Likewise, if the cell 14 does not conduct (e.g., considerably less current than 50–100 $\mu A$), then the cell 14 has been programmed (the cell 14 is therefore at a second logic state, e.g., a one "1"). Consequently, one can read each cell 14 to determine whether it has been programmed (and therefore identify its logic state).

A flash memory cell 14 can be erased in a number of ways. In one arrangement, a relatively high voltage Vs (e.g., approximately 12–20 volts) is applied to the source 14b and the control gate 17d is held at a ground potential ($V_G$=0), while the drain 14a is allowed to float. Under these conditions, a strong electric field is developed across the tunnel oxide 17a between the floating gate 17b and the source 14b. The electrons that are trapped in the floating gate undergo Fowler-Nordheim tunneling through the tunnel oxide 17a to the source 14b. In another arrangement, applying a negative voltage on the order of minus 10 volts to the control gate, applying 5 volts to the source and allowing the drain to float can also erase a cell. In a further arrangement, applying 5 volts to the P-well and minus 10 volts to the control gate while allowing the source and drain to float erases a cell.

If an unprogrammed flash cell 14 in an array of such cells is repeatedly erased under these conditions, the floating gate 17b will eventually acquire a more positive potential due to an excess of holes therein. Consequently, even with the control gate 14c being grounded the cell 14 will always be turned on a small amount which causes column leakage current, thereby preventing the proper reading of any other cell in the column of the array containing this cell. In addition, such a condition makes programing of the other cells in the same column increasingly more difficult. This condition often is referred to as "bit over-erase" which is disadvantageous since the data programming characteristics of the memory cell 14 is deteriorated so as to cause endurance failures.

The issue of column leakage is significant because in many arrays 512 flash cells are associated with each bit line (BL). Thus if each of the 511 non-selected cells in the bit line are exhibiting leakage, power dissipation increases which is highly disadvantageous in portable applications, for example, in which a battery is used as the power supply. In addition, reading the data associated with the selected cell is more difficult because the current associated with the 511 "leaky" cells is also detected and a determination must then be made whether the detected current reflects a "0" from a conducting selected cell or instead is really a "1" and the detected current simply reflects the cumulative leakage current of the leaky cells.

There is a strong need in the art for a flash memory device structure, architecture and process for manufacture that improves the performance and reliability of the device.

SUMMARY OF THE INVENTION

The present invention relates to a circuit architecture and method of reading data or programming data in a flash memory in which column leakage associated with over-erased bits is greatly reduced.

According to one aspect of the present invention, a NOR flash memory architecture is disclosed in which individually selectable source lines are run generally parallel to the word lines (e.g., horizontally). In addition, two memory cells associated with a given bit line are coupled in parallel between the bit line and a unique individually selectable source line, yet are connected to separate word lines. Consequently, when reading a desired memory cell, column leakage only occurs with respect to the "parallel cell" and the remaining cells associated with the selected bit line do not experience any column leakage. With such an implementation column leakage is reduced by about three (3) or more orders or magnitude over the prior art. Accordingly, power dissipation associated with column leakage current is greatly reduced and the temperature compensation associated with the column leakage is simplified substantially. Furthermore, the architecture of the present invention operates in a manner which is similar to conventional NOR architecture operation, needs only minimal additional logic, and does not require additional metal layers to implement.

According to one aspect of the present invention, a NOR-type flash memory array architecture is disclosed. The flash memory architecture comprises a plurality of flash memory cells which are electrically organized in a column, wherein a drain terminal of each of the flash memory cells are coupled together and for an array bitline input. Further, the control gate terminal associated with each of the flash cells are coupled to a different wordline input. In addition, at least one of the flash cells in the array has a source terminal which is electrically isolated from one or more of the source terminals of the other flash cells in the array. Consequently, when the flash cell having the electrically isolated source terminal is selected, for example, to be read, a leakage current associated with flash cells due to a bit over-erase condition is reduced substantially, thereby decreasing power dissipation and increasing cell read accuracy.

According to another aspect of the present invention, a NOR-type flash memory architecture is disclosed which comprises an M×N array of flash memory cells, wherein M represents a number of columns or bitlines, and N represents a number of rows or wordlines. In the M×N array, each flash memory cell associated with a given bitline has a drain terminal coupled thereto and each flash memory cell associated with the given bitline has a control gate terminal coupled to a different wordline input. Furthermore the flash memory cells along the given bitline are separated into pairs, wherein each pair of cells are coupled together in parallel between the bitline input and an individually selectable source line which is coupled to a source terminal of each flash cell in the pair. The individually selectable source lines allow electrical isolation between one pair of flash cells from the other flash cells associated with the same bitline, thereby reducing substantially column leakage during programming and reading.

In accordance with yet another aspect of the present invention, a method of programming a flash memory cell in a flash memory array is disclosed. The method includes identifying a flash memory cell in the array for programming and individually selecting a source line associated with the identified cell, wherein the selected source line is not associated with all of the flash cells in the flash memory array. The bitline associated with the identified flash memory cell is then coupled to a voltage potential to facilitate programming and a programming voltage is coupled to a wordline associated with the identified cell.

In accordance with still another aspect of the present invention, a method of reading a flash memory cell in a flash memory array is disclosed. The method includes identifying a flash memory cell in the array for programming and individually selecting a source line associated with the identified cell, wherein the selected source line is not associated with all of the flash cells in the flash memory array. The bitline associated with the identified flash memory cell is then coupled to a voltage potential to facilitate reading and a read voltage is coupled to a wordline associated with the identified cell. The current in the associated bitline is then sensed and used to determine whether or not the identified memory cell has been programmed.

In accordance with another aspect of the present invention, a method of programming a NOR type flash cell is disclosed. During programming, one or more of the unselected bitlines are grounded or set at a voltage which is less that the programming voltage of the selected bitline, as opposed to floating all unselected bitlines as is done in the prior art. By setting a voltage of one or more of the unselected bitlines during programming, the source side resistance of the selected cell is reduced, thus providing a larger drain-to-source voltage and consequently a faster programming speed.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1a is a plan view of a conventional flash memory device illustrating core regions and peripheral regions, respectively;

FIG. 1b is a schematic diagram illustrating a conventional NOR-type flash memory circuit architecture;

FIG. 1c is a cross section diagram illustrating a conventional stacked gate flash memory cell;

DETAILED DESCRIPTION OF THE INVENTION

Figure 2:
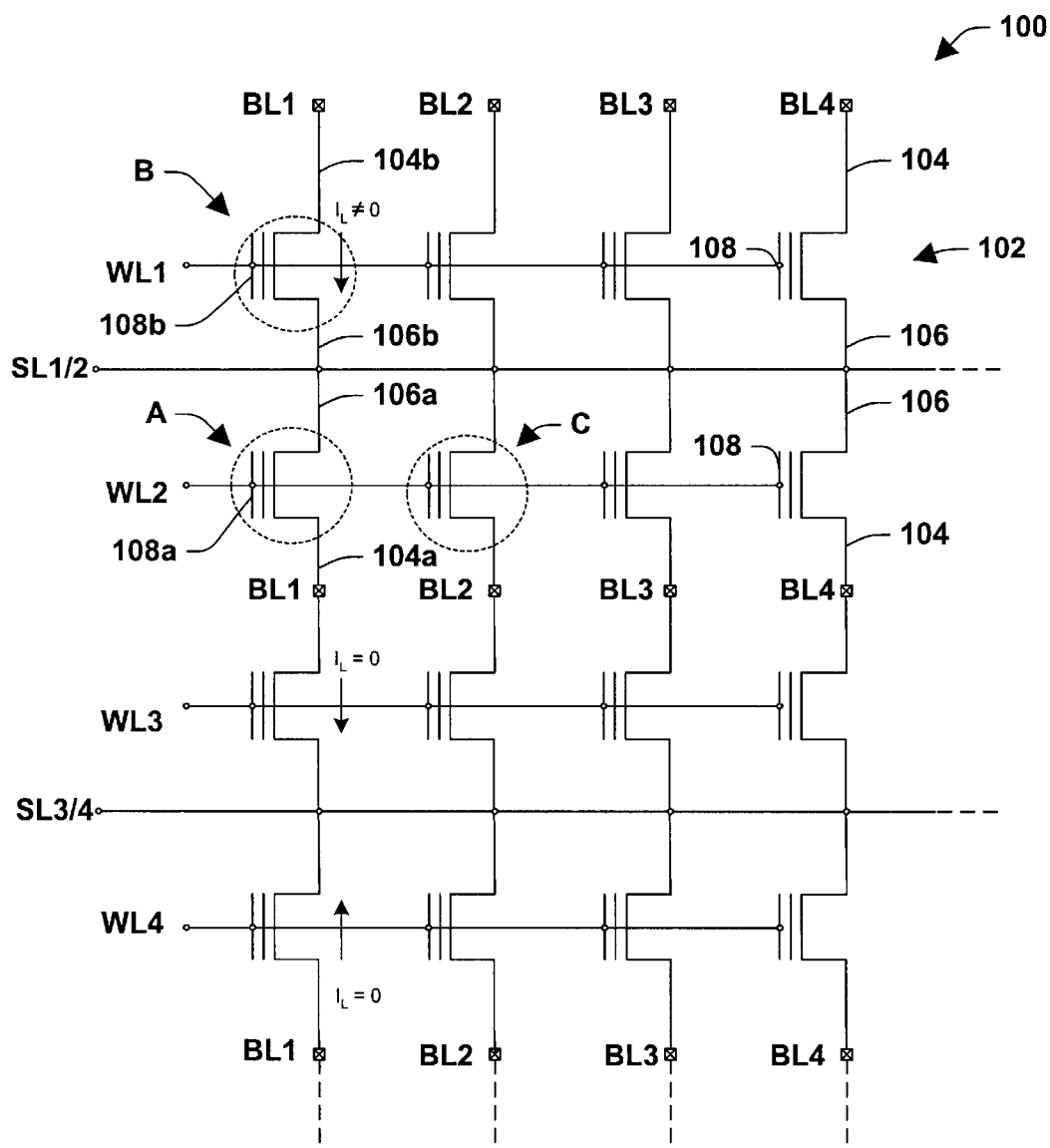
FIG. 2 is a schematic diagram illustrating a NOR-type flash memory circuit architecture in accordance with one aspect of the present invention.

The present invention will now be described with reference to the drawings, wherein like reference numerals are used to refer to like elements throughout.

The present invention provides a circuit architecture and a method of operation associated with a NOR-type flash memory circuit in which horizontal source lines (e.g., generally parallel to the wordlines) are employed which may be individually selected during a read or programming (write) step. Consequently, during read or programming, only those flash cells associated with the one selected source line will be available to contribute to potential leakage current. Therefore by minimizing a number of flash cells associated with each individually selectable source line leakage current, for example, caused by bit over-erase conditions, is limited to only those cells associated therewith, as opposed to all the cells of a given bitline as in the prior art. Consequently, power dissipation is decreased and cell read accuracy is simplified and improved.

Referring now to the figures, FIG. 2 is a schematic diagram illustrating a NOR type flash circuit architecture portion 100 according to one exemplary aspect of the present invention. The architecture 100 includes an array (e.g., about 512×512 cells, although only a 4×4 sub-array is illustrated for purposes of simplicity) of bit lines (BL1–BL4) and word lines (WL1–WL4). The various cells 102 consist of a drain terminal 104, a source terminal 106 and a control gate terminal 108, respectively, and are arranged in columns along each respective bit line and in rows along each respective word line such that the various cells may be individually addressed.

In contrast to conventional architectures such as that illustrated in prior art FIG. 1b, each of the source terminals 106 are not connected to a common source line (CS). Instead, a pair of cells (e.g., cells A and B illustrated in FIG. 2) are connected in parallel between a bit line (e.g., BL1) and an individually selectable source line (SL) (e.g., SL1/2) which runs generally parallel (e.g., horizontally) to the word lines. That is, both drain terminals of cells A and B are connected to the same bitline (e.g., BL1) and both source terminals are connected to the individually selectable source line (e.g., SL1/2), while cells A and B have their control gate terminals coupled to different wordlines (e.g., WL2 and WL1, respectively). The source lines of architecture 100 are called individually selectable source lines because each source line may be individually addressed via control logic circuitry (not shown) as opposed to the prior art architecture in which all of the source terminals in the entire array are addressed collectively.

The architecture 100 of FIG. 2 operates in a manner which is similar to conventional NOR circuit implementations, however, the individually selectable source line (SL) architecture results in a substantial reduction in column leakage. The reduction in column leakage in the architecture 100 is due to the individually selectable source lines (SL) isolating two cells associated with a given bit line from the other cells associated with the same bit line. How this functionality occurs may best be understood in conjunction with the following example.

Figure 3:
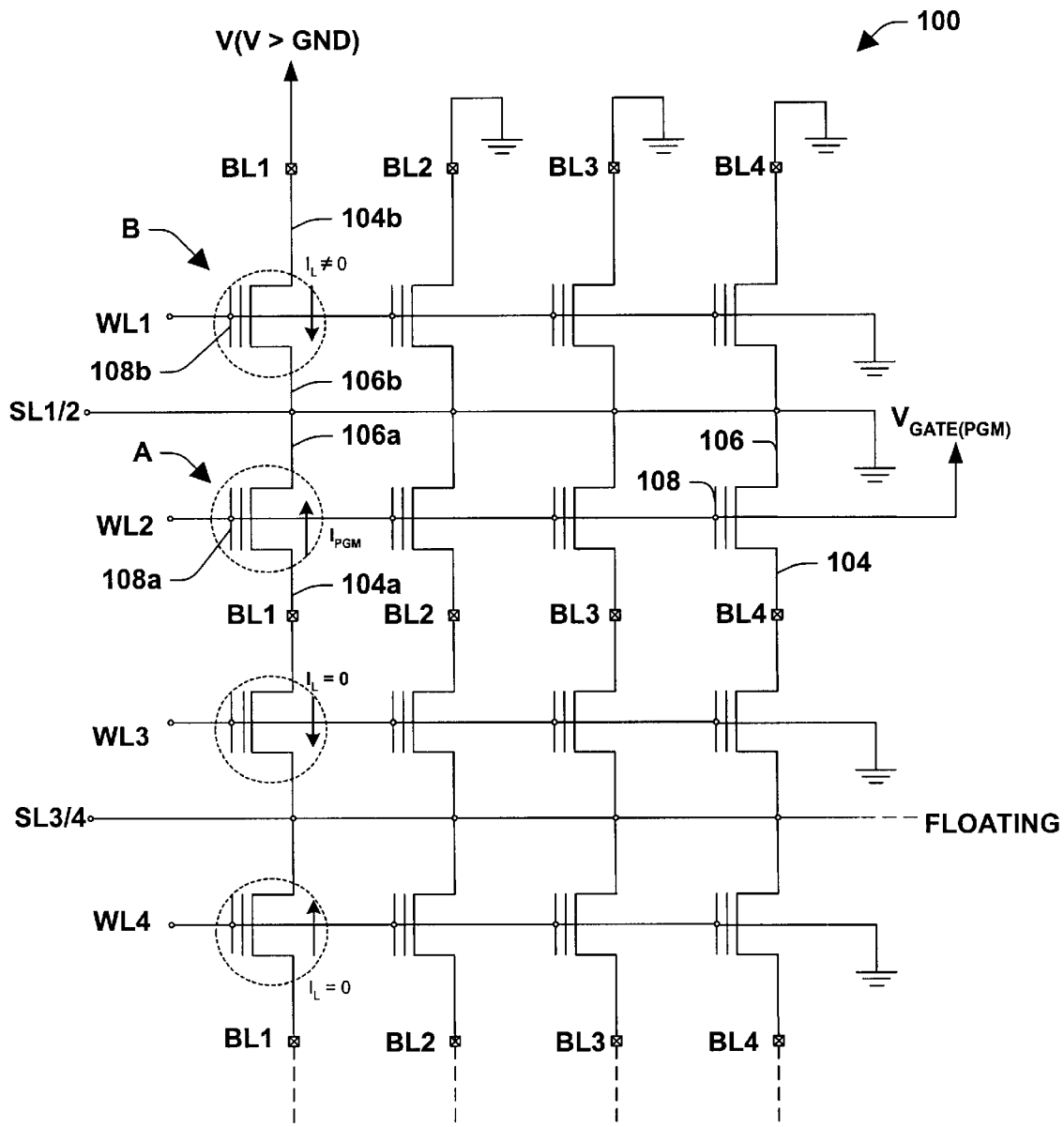
FIG. 3 is a schematic diagram illustrating a programming or write operation with the NOR-type flash memory circuit architecture of FIG. 2 in accordance with one aspect of the present invention.

When programming a particular cell, for example, cell A of FIG. 2, a high voltage ($V_{GATE(PGM)}$) is applied to its word line (WL2) so as to apply the voltage to the control gate 108a of cell A. All the other word lines are grounded. In addition, the individually selectable source line associated with cell A (SL1/2) is connected to ground while the other individually selectable source lines are allowed to float. Lastly, a voltage having a value which is a predetermined amount greater than ground is applied to the bit line associated with cell A (BL1) so as to apply the voltage to the drain of cell A, while the other bit lines are grounded. Such an exemplary circuit condition is illustrated in FIG. 3. These voltages generate a vertical and lateral electric field along the length of the channel from the source to the drain of cell A. This electric field causes electrons to be drawn off the source and begin accelerating toward the drain of cell A, where they are able to jump over the potential barrier of the oxide into the floating gate, causing the threshold voltage of the cell to increase. At the same time, cell B also has a voltage across its drain and source terminals (due to the bit line (BL1) and individually selectable source line (SL1/2) addressing).

Although the control gate of cell B is grounded (WL1), positive charge which may have accumulated within its floating gate due to the over-erase phenomena described supra may cause cell B to experience leakage (e.g., $I_L \neq 0$). However, as illustrated in FIG. 3, cell B is the only cell along its bit line (BL1) which will experience leakage because all the other nonselected cells (e.g., cells C and D) are coupled to separate individually selectable source lines which are not grounded, but rather are floating. Consequently, although the bit line (BL1) has been addressed, because the source terminals of all the other cells associated with BL1 are floating, any positive charge in their floating gates will not generate column leakage current. Therefore the column leakage associated with the architecture 100 of the present invention during cell programming is limited to only 1 cell on the bit line instead of all the cells associated therewith (e.g., 511 cells) as in the prior art.

Figure 4:
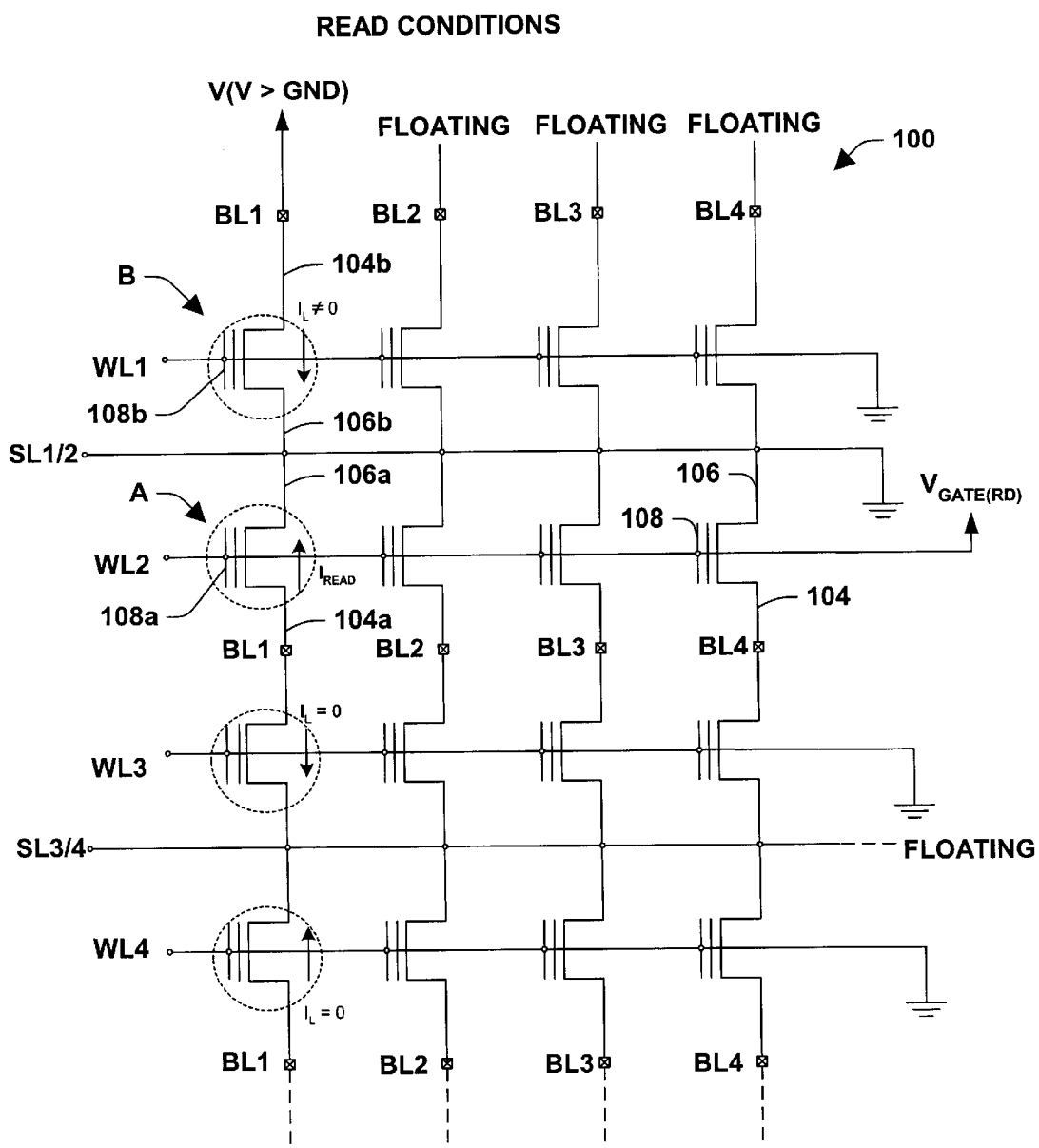
FIG. 4 is a schematic diagram illustrating a read operation with the NOR-type flash memory circuit architecture of FIG. 2 in accordance with one aspect of the present invention.

The beneficial performance of the NOR architecture 100 of the present invention is also achieved during a read operation, as illustrated in FIG. 4. When performing a read of cell A, a read voltage ($V_{GATE(RD)}$) which is higher than a threshold voltage of an unprogrammed cell and lower than a threshold voltage of a programmed cell is applied to the control gate 108a (WL2), and all the other wordlines are grounded. In addition, the individually selectable source line associated with cell A (SL1/2) is connected to ground while the other individually selectable source lines are allowed to float. Lastly, a voltage having a value which is a predetermined amount greater than the source voltage (which in this case the source is grounded) is applied to the bitline (BL1) so as to apply the voltage to the drain 104a of cell A, while the other bitlines are floating. In this case, if cell A has been programmed the threshold voltage of cell A is greater than the control gate voltage ($V_{GATE(RD)}$, WL2), and no conduction occurs through cell A. In addition, cell B may experience some leakage due to it being coupled in parallel with cell A. Therefore any detected current will be due to the leakage current associated with cell B. Since this leakage current is still substantially less than the amount of current expected in an erased cell, an accurate determination of whether cell A has been programmed can be easily made, thus greatly improving the read reliability of the flash memory.

As discussed above, the architecture 100 of the present invention improves the power management of the flash memory device by reducing the amount of column leakage current during the programming and reading of a cell. In addition, the reduction in column leakage improves the readability of the cell. The improvement in readability allows the current detect circuitry used to determine whether or not a given cell is programmed to be greatly simplified. For example, since the architecture 100 of the present invention provides for a reduction in column leakage current of about three (3) order of magnitude (about 1000×or so), the sensitivity of the current detect circuitry need not be as sophisticated as in the prior art. In addition, since column leakage current is a function of temperature (increasing as the die temperature increases), the substantial reduction in column leakage current allows for a substantial simplification in the temperature compensation circuitry or, in some cases, may allow for the elimination of such circuitry altogether.

Figures 5, 6:
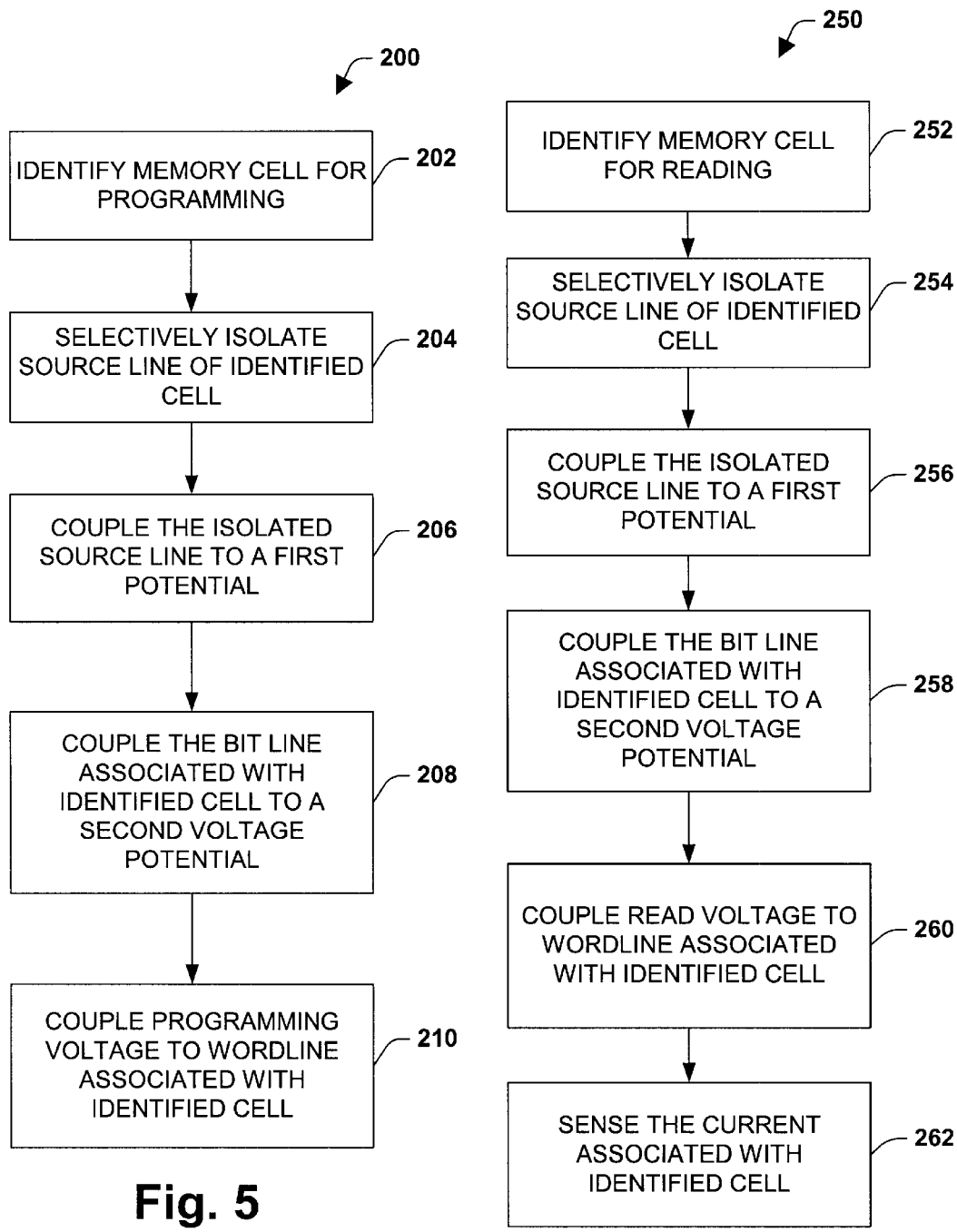
FIG. 5 is a flow chart diagram illustrating a method of programming a cell in a NOR-type flash memory circuit architecture in accordance with one aspect of the present invention.
FIG. 6 is a flow chart diagram illustrating a method of reading a cell in a NOR-type flash memory circuit architecture in accordance with one aspect of the present invention.

According to another aspect of the present invention, a method of programming a flash memory cell is illustrated in FIG. 5, and designated at reference numeral 200. Initially, the method 200 begins at step 202 in which the flash memory cell to be programmed is identified. The source line associated with the identified flash cell is then electrically isolated from the source lines of one or more other flash cells within the same bitline as the identified flash cell at step 204. According to one embodiment of the present invention, two flash cells are coupled in parallel between the bitline and an individually selectable source line.

The isolated source line is then coupled to a first voltage potential at step 206. For example, the isolated source line is coupled to circuit ground while the other source lines are allowed to float. The bitline associated with the identified cell is then coupled to a second voltage potential at step 208, for example, to a voltage which is a predetermined amount greater than the first voltage. A programming voltage is then coupled to the wordline associated with the identified cell. Further, because only the individually selectable source line associated with the identified flash cell is coupled to ground, any leakage associated therewith is due solely to those cells similarly coupled to that source line. Consequently, by limiting a number of cells associated with a given source line and having the source lines individually selectable, the leakage current may be reduced substantially, thereby reducing power dissipation.

According to another aspect of the present invention, a method of reading a flash memory cell is disclosed in FIG. 6, and designated at reference numeral 250. Initially, method 250 begins at step 252 by identifying the flash memory cell to be read. A source line associated with the identified flash cell is then electrically isolated from the other source lines associated with the flash array at step 254. The isolated source line is then coupled to a first potential at step 256, for example, the source line associated with the identified flash cell may be coupled to circuit ground. The other source lines associated with the array may be allowed to float. The bitline associated with the identified cell is then coupled to a second voltage potential at step 258, for example, which is a predetermined amount greater than the first potential.

The method 250 continues at step 260, wherein a read voltage is coupled to the wordline associated with the identified cell. The current associated with the identified cell is then sensed at step 262. If the cell had been previously programmed (e.g., a "0"), only a leakage current from the parallel bits coupled to the same source line will flow, and if the cell had not been programmed (e.g., a "1"), a substantial current would be detected.

Because the source line associated with the identified cell is isolated from the other source lines (for example, it is individually selectable) only those flash cells coupled to that particular isolated source line will contribute to any leakage current. For example, if two flash cells are coupled in parallel between the bitline and the isolated source line (and yet be connected to different wordlines), any leakage current sensed during a read operation will be due only to the one cell coupled in parallel to the identified flash cell. Consequently, column leakage current ay be greatly reduced. For example, if the identified cell is programmed, the total current sensed will be leakage current associated with only two cells as opposed to all the cells of that bitline, consequently the current sense circuitry can easily determine that the cell has been programmed.

Figure 7:
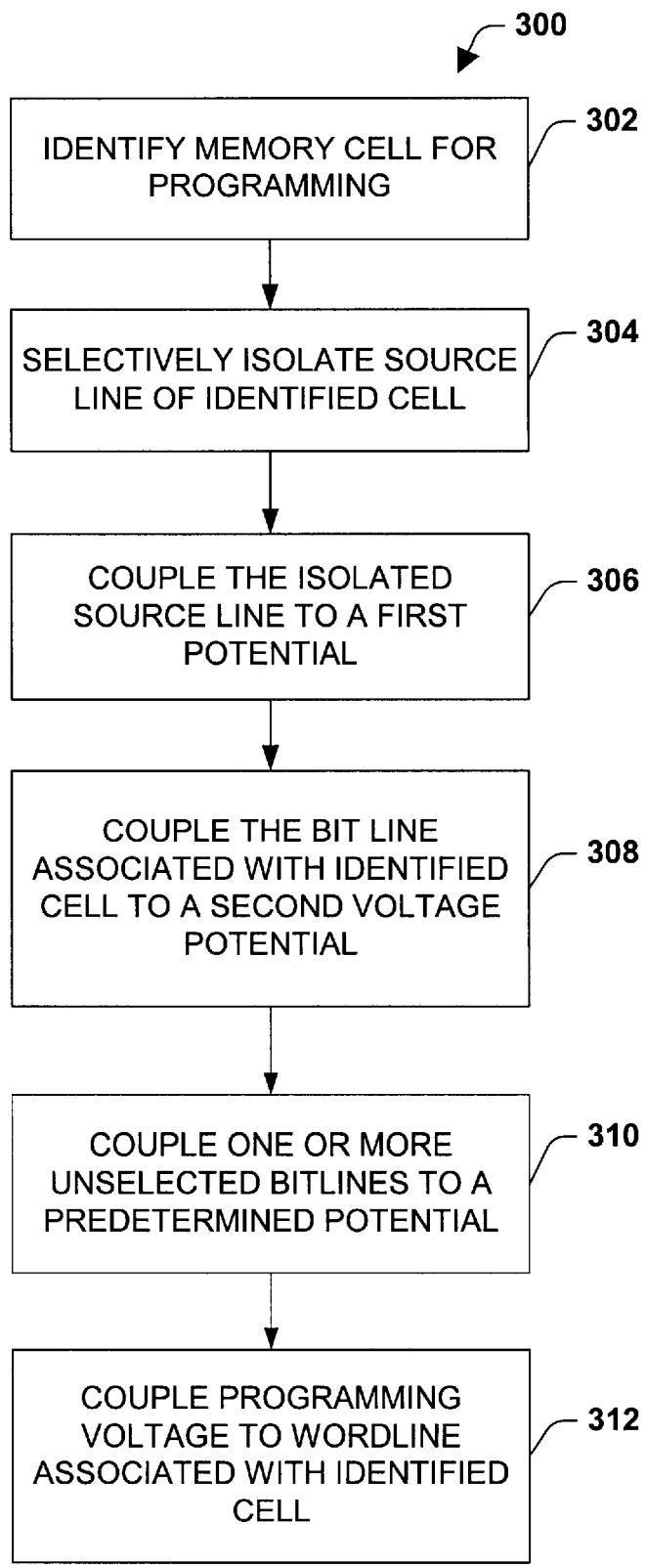
FIG. 7 is a flow chart diagram illustrating a method of programming a cell in a NOR-type flash memory circuit architecture in accordance with one aspect of the present invention.

In accordance with another aspect of the present invention, a method of programming a NOR-type flash array is illustrated in the flow chart of FIG. 7, and designated at reference numeral 300. Although the method 300 will be described in conjunction with the NOR-type architecture described above in FIG. 3, the present invention is equally applicable to other NOR-type flash circuit architectures, and such alternatives are contemplated as falling within the scope of the present invention.

The method 300 begins at step 302 in which the flash memory cell to be programmed is identified. The source line associated with the identified flash cell is then electrically isolated from the source lines of one or more other flash cells within the same bitline as the identified flash cell at step 304. According to one embodiment of the present invention, two flash cells are coupled in parallel between the bitline and an individually selectable source line. Of course, in other type NOR-type architectures, step 304 may be eliminated, as may be desired.

The isolated source line of the present example is then coupled to a first voltage potential at step 306. For example, the isolated source line is coupled to circuit ground while the other source lines are allowed to float. The bitline associated with the identified cell is then coupled to a second voltage potential at step 308, for example, to a voltage which is a predetermined amount greater than the first voltage (see, e.g., BL1 of FIG. 3). The remaining non-selected bitlines are then coupled to another voltage potential which is less than the selected bitline potential (e.g., BL2, BL3 and BL4 coupled to circuit ground potential as illustrated in FIG. 3) at step 310. Although circuit ground is used in the present example, the present invention contemplates using any potential which is less than the selected bitline potential.

Coupling the non-selected bitlines to a potential which is less than the selected bitline potential as in step 310 differs from prior art programming methodologies which allow non-selected bitlines to float. For example, when the non-selected bitlines are coupled to circuit ground potential, the source resistance of the selected cell is reduced substantially. The reduction in source resistance is due to the existence of additional current paths to ground provided by cells which exist along the same wordline as the selected cell. That is, if cell A of FIG. 3 is the selected cell for programming, since BL2, BL3 and BL4 (the non-selected bitlines) are each grounded, current in cell A during programming can travel to ground along SL1/2 and across any cell sharing SL1/2 along WL2 (e.g., cell C and/or other cells along WL2). Therefore the source resistance of cell A is lowered, which means that the source 106a of cell A is closer to true circuit ground potential. Consequently, during programming of the selected cell, the drain-to-source voltage drop thereacross (e.g., $V_{DS}$ of cell A) is greater than in prior art methodologies, which results in a faster programming speed for a cell. As is well appreciated, improving the rate at which cells may be programmed is highly advantageous.

The method 300 then continues at step 312, wherein a programming voltage is then coupled to the wordline associated with the identified cell. Further, because of the exemplary NOR-type flash architecture of FIG. 3, because only the individually selectable source line associated with the identified flash cell is coupled to ground, any leakage associated therewith is due solely to those cells similarly coupled to that source line. Consequently, by limiting a number of cells associated with a given source line and having the source lines individually selectable, the leakage current may be reduced substantially, thereby reducing power dissipation.

In the above exemplary method 300, all of the non-selected bitlines were coupled to a voltage potential which is less than the selected bitline voltage. Alternatively, however, the present invention may be employed in instances where only one or multiple non-selected bitlines are so coupled, while the remaining non-selected bitlines are allowed to float. In such an instance, although the source resistance of the selected cell would not be as low as possible (if all non-selected bitlines were prohibited from floating), the selected cell source resistance would still be lower than the prior art, thus providing for a faster programming speed.

While the above invention has been discussed in conjunction with a stacked gate type flash memory cell, it should be understood that the present invention applies equally to other type flash memory cell structures, and such alternative structures are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of programming a NOR-type flash memory array, comprising the steps of:

identifying a flash memory cell in the array for programming;

coupling a source line associated with the identified cell to a source programming voltage potential, wherein coupling the source line comprises individually selecting the source line associated with the identified cell, and wherein individually selecting the source line associated with the identified cell comprises:

coupling the source line associated with the identified flash cell to a circuit ground potential; and allowing one or more other source lines associated with the flash memory array to float;

coupling a bitline associated with the identified flash memory cell to a voltage potential which is greater than the source programming voltage potential, wherein the coupled bitline comprises a selected bitline;

coupling one or more non-selected bitlines to a voltage potential which is less than the voltage potential of the selected bitline; and coupling a programming voltage to a wordline associated with the identified cell.

2. A method of programming a NOR-type flash memory array, comprising the steps of:

identifying a flash memory cell in the array for programming;

coupling a source line associated with the identified cell to a source programming voltage potential;

coupling a bitline associated with the identified flash memory cell to a voltage potential which is greater than the source programming voltage potential, wherein the coupled bitline comprises a selected bitline;

coupling one or more non-selected bitlines to a voltage potential which is less than the voltage potential of the selected bitline, wherein the voltage potential coupled to the one or more non-selected bitlines comprises a circuit ground potential, thereby decreasing a source resistance of the identified flash cell during programming, and resulting in an increased programming speed; and coupling a programming voltage to a wordline associated with the identified cell.

3. A method of reducing source resistance of a selected flash cell in a NOR-type flash array during programming, comprising the steps of:

identifying a flash memory cell in the NOR-type flash array for programming;

coupling a source terminal of the identified flash memory cell to a source programming potential through a plurality of current paths, thereby reducing the source resistance of the source terminal of the identified cell;

coupling a bitline associated with the identified flash memory cell to a voltage potential which is greater than the source programming voltage potential, wherein the coupled bitline comprises a selected bitline; and coupling a programming voltage to a wordline associated with the identified cell.

4. The method of claim 3, wherein coupling the source terminal to the source programming potential through the plurality of current paths comprises coupling one or more non-selected bitlines to the source programming potential, wherein during programming, current may conduct to the source terminal of the identified flash cell as well as to a source terminal of a flash cell on the wordline which is associated with the one or more non-selected bitlines which are coupled to the source programming potential.

5. The method of claim 3, wherein the source programming potential comprises circuit ground potential.

6. A method of programming a NOR-type flash memory array, comprising the steps of:
  identifying a flash memory cell in the array for programming;
  individually selecting a source line associated with the identified cell, wherein the selected source line is not associated with all of the flash cells in the flash memory array, and wherein individually selecting the source line associated with the identified cell, comprises:
    coupling the source line associated with the identified flash cell to a circuit ground potential; and
    allowing one or more other source lines associated with the flash memory array to float;
  coupling a bitline associated with the identified flash memory cell to a voltage potential, wherein the coupled bitline comprises a selected bitline;
  coupling one or more non-selected bitlines to a voltage potential which is less than the voltage potential of the selected bitline; and
  coupling a programming voltage to a wordline associated with the identified cell.

7. A method of programming a NOR-type flash memory array, comprising the steps of:
  identifying a flash memory cell in the array for programming;
  individually selecting a source line associated with the identified cell, wherein the selected source line is not associated with all of the flash cells in the flash memory array;
  coupling a bitline associated with the identified flash memory cell to a voltage potential, wherein the coupled bitline comprises a selected bitline;
  coupling one or more non-selected bitlines to a voltage potential which is less than the voltage potential of the selected bitline, wherein the voltage potential coupled to the one or more non-selected bitlines comprises a circuit ground potential, thereby decreasing a source resistance of the identified flash cell during programming, and resulting in an increased programming speed; and
  coupling a programming voltage to a wordline associated with the identified cell.

8. A method of programming a flash memory cell within a flash memory array, the flash memory array comprising a NOR-type flash memory architecture having an M×N array of flash memory cells, wherein M represents a number of electrically organized columns or bitlines and N represents a number of electrically organized rows or wordlines, and wherein each flash memory cell associated with a given bitline has a drain terminal coupled to a bitline input associated therewith, and wherein each flash memory cell associated with a given bitline has a control gate terminal coupled to a different wordline input, and wherein the flash memory cells along a given bitline are separated into pairs, wherein each pair is coupled in parallel between the bitline input and an individually selectable source line which is coupled to a source terminal of the pair of flash memory cells, and wherein the individually selectable source lines provide electrical isolation between one pair of flash memory cells from the other flash memory cells associated with a given bitline, the method comprising the steps of:
  identifying a flash memory cell for programming;
  selecting one of the individually selectable source lines associated with the identified flash memory cell by coupling a first voltage potential thereto and allowing the other individually selectable source lines not associated with the identified flash memory cell to float;
  coupling the bitline associated with the identified flash memory cell to a second voltage potential which is greater than the first voltage potential, wherein the coupled bitline comprises a selected bitline;
  coupling one or more non-selected bitlines to a voltage potential which is less than the second potential; and
  coupling a programming voltage to the wordline associated with the identified flash memory cell.

9. The method of claim 8, wherein the voltage potential coupled to the one or more non-selected bitlines comprises the first voltage potential, thereby decreasing a source resistance of the identified flash cell during programming, and resulting in an increased programming speed.

10. The method of claim 8, wherein the step of coupling one or more non-selected bitlines comprises coupling each of the non-selected bitlines to the voltage potential which is less than the first voltage potential.

* * * * *